F-M ALIGNMENT OSCILLATOR
Filed Feb. 13, 1946
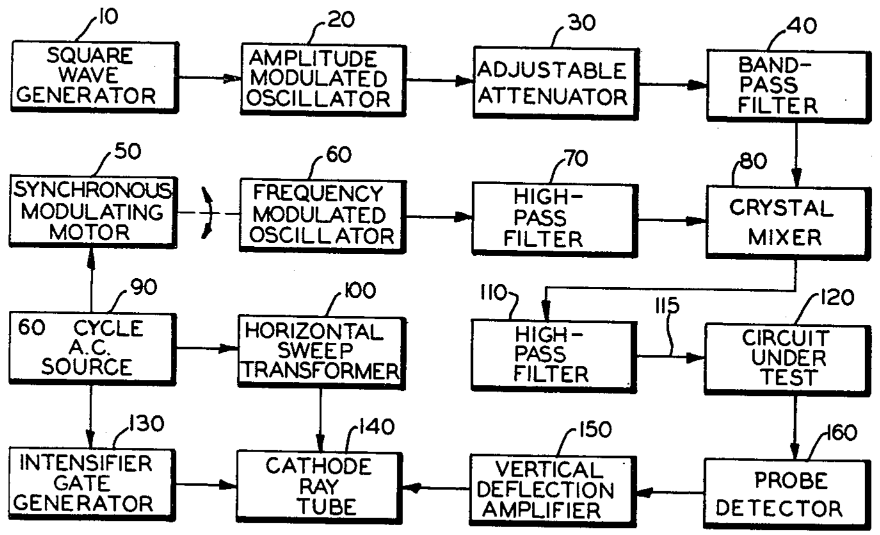
INVENTORS.
HAROLD L. JOHNSON
JAMES L. LAWSON
BY M. O. Hayes
ATTORNEY United States Patent Office 2,755,437

Patented July 17, 1956

2,755,437

F-M ALIGNMENT OSCILLATOR

Harold L. Johnson, Denver, Colo., and James L. Lawson, Schenectady, N. Y., assignors, by mesne assignments, to the United States of America as represented by the Secretary of the Navy Application February 13, 1946, Serial No. 647,390

8 Claims. (Cl. 324—57)

This invention relates to a signal generator, and more particularly, to a frequency modulated oscillator having a uniform power output over a wide range of frequency deviation.

Vacuum tube amplifiers having very wide pass bands, such as television and radar intermediate frequency and video amplifiers, are often aligned or adjusted under conditions in which the immediate results of such adjustments are visible on the screen of a cathode ray tube. The apparatus involved usually comprises a frequency modulated oscillator, a detector, and a cathode ray oscilloscope. The input of the circuit under test is energized by the output of the frequency modulated oscillator, while the detector is energized by the output of the circuit under test. The output of the detector is impressed upon the vertical deflection terminals of the oscilloscope, while the horizontal sweep is synchronized with the effective instantaneous frequency of the oscillator. The trace thus produced on the screen of the cathode ray tube has a shape substantially the same as that of a gain versus frequency graph for the circuit under test, provided, of course, that the test apparatus introduces no appreciable distortion. Actually, however, it is extremely difficult to provide an oscilloscope deflection amplifier having a high deflection sensitivity, satisfactory stability, and small phase shift at very low operating frequencies. Amplifiers having suitable low frequency response characteristics are susceptible to trouble caused by hum pickup, tube microphonics, and shifts in power supply parameters.

The frequency deviation of the oscillator must be at least equal to the bandwidth of the circuit under test, and preferably should be three to four times as great if dependable results are to be obtained. It is desirable that the mean frequency of the oscillator be easily adjustable and that the output amplitude remain constant within narrow limits throughout the frequency modulation cycle. This requirement is difficult to fulfill in the conventional manner in view of the wide frequency deviation which must be produced.

It is an object of this invention to provide a novel wide band frequency modulated signal generator.

It is another object of this invention to provide a frequency modulated signal generator having an easily adjustable mean frequency.

It is a further object of this invention to provide a frequency modulated signal generator having a high ratio of frequency deviation to mean output frequency.

It is a still further object of this invention to provide a frequency modulated signal generator having an output uniform within narrow limits throughout the modulating cycle.

It is still another object of this invention to provide a means for indicating visually the frequency response characteristics of an electrical circuit.

These and other objects will be more apparent upon consideration of the following description and the accompanying drawing, which is a functional block diagram of an embodiment of this invention.

Referring to the drawing, a square-wave generator 10 excites an amplitude modulated oscillator 20 having an adjustable output frequency, and which has its output connected to a first input of crystal mixer 80 through an adjustable attenuator 30 and a band-pass filter 40.

A frequency modulated oscillator 60, modulated by a suitable means such as a mechanically movable tuning element rotated by a synchronous modulating motor 50 energized by a 60-cycle alternating current source 90, has its output connected through a high-pass filter 70 to a second input of crystal mixer 80.

From modulation theory, it can be seen that the output current of the crystal mixer 80 will contain a series of alternating frequency components, among which is the difference frequency between the output frequencies of oscillators 20 and 60. This difference frequency will be amplitude modulated as well as frequency modulated. If oscillators 20 and 60 are tuned to very high frequencies, such as several thousand megacycles per second, and if their respective output frequencies differ by only a few per cent, a very small ratio of frequency deviation to mean output frequency of oscillator 60 will produce a very high ratio of frequency deviation to mean frequency of the difference frequency contained in the crystal mixer output current. Thus a wide frequency deviation is secured in the beat frequency output of mixer 80 by means of a relatively narrow deviation in the output frequency of oscillator 60, resulting in a very uniform power output throughout the frequency modulation cycle.

One of the conditions which must be met if the beat frequency output of the crystal mixer is to have a constant amplitude over a wide frequency range is that the input impedance presented to the crystal be constant at all frequencies at which alternating components exist in the mixer output current. Isolating impedances comprising band-pass filter 40 and high-pass filter 70 are connected between the mixer inputs and the outputs of oscillators 20 and 60, respectively, to produce these uniform line impedance characteristics. Band-pass filter 40 can be of any suitable high-Q type, such as a resonant cavity, while high-pass filter 70 can be a conventional L-section filter having a small capacitor in series with the line and an inductive stub in parallel with the line.

The output current of crystal mixer 80 energizes the input of a high-pass filter 110 which attenuates the amplitude modulating frequency component produced by the detection in the mixer of the output of amplitude modulated oscillator 20.

The output of high-pass filter 110 is coupled by a very short coaxial line 115 to the input of the circuit 120 under test. Line 115 must be terminated in its characteristic impedance and preferably should be of a length not exceeding twelve inches to prevent discrepancies in results due to the variation in line impedance over a wide range of frequencies.

The output of the circuit 120 under test energizes the input of a probe or other suitable detector 160 which in turn energizes the input of the vertical deflection amplifier 150. Amplifier 150 is tuned to pass only a relatively narrow band of frequencies centered about the modulation frequency of the amplitude modulated oscillator 20. In the preferred embodiment of the invention an amplitude modulating frequency of 100 kilocycles per second was chosen.

A horizontal sweep transformer 100, energized by a 60 cycle alternating current source 90, is connected to the horizontal deflection plates of a cathode ray tube 140 to produce a horizontal sweep varying sinusoidally with respect to time. An intensifier gate generator 130, also energized by source 90, is connected to the cathode ray tube in the conventional manner to increase the beam intensity during the desired period of time.

If the frequency modulation of oscillator 60 is accomplished by means of a rotating tuning element, as in the preferred embodiment of the invention, sinusoidal variation of frequency with respect to time can be produced by proper selection of the shape of the tuning element. Since the beat frequency output of mixer 80 and the horizontal sweep voltage both vary sinusoidally with respect to time, the horizontal axis of the cathode ray tube 140 can be calibrated with a linear frequency scale.

In operation, the pattern appearing upon the screen of tube 140 is the envelope of the band-pass characteristics of the circuit 120 under test. In a preferred embodiment of the present invention, an adjustable mean output frequency of from zero to 400 megacycles per second is obtained with a frequency deviation of 110 megacycles per second and a total variation of amplitude during the modulating cycle of less than 1 db.

Since certain changes may be made in the above described apparatus and different embodiments of the invention could be made without departing from the scope thereof, it is intended that all matter contained in the above description or shown in the accompanying drawing shall be interpreted as illustrative and not in a limiting sense, and particularly, that operating frequencies of apparatus herein described be regarded as illustrative only, and therefore, the invention is to be limited only by the prior art and the spirit of the appended claims.

What is claimed is:

1. A frequency modulated signal generator comprising, a first oscillator having an adjustable output frequency, means for amplitude modulating said first oscillator, an adjustable attenuator having its input energized by the output of said first oscillator, a first isolating impedance having its input connected to the output of said attenuator, a mixer having first and second input circuits, said first input circuit being connected to the output of said first isolating impedance, a second oscillator, means for frequency modulating said second oscillator, a second isolating impedance having its input connected to the output of said second oscillator, the output of said second isolating impedance energizing said second input circuit of said mixer, and a high-pass filter having its input energized by the output of said mixer, the output of said filter being an amplitude modulated signal having a frequency instantaneously equal to the difference between the frequency of said first oscillator and the frequency of said second oscillator.

2. Apparatus for visually indicating the frequency response characteristics of an electrical circuit comprising, a power source, a first oscillator having an adjustable output frequency, an amplitude modulator, said modulator acting upon said first oscillator, an adjustable attenuator having its input energized by the output of said first oscillator, a first isolating impedance having its input connected to the output of said attenuator, a mixer having first and second input circuits, said first input circuit being connected to the output of said first isolating impedance, a second oscillator, a mechanically movable tuning element coupled to said oscillator, a synchronous motor mechanically connected to said tuning element, a second isolating impedance having its input connected to the output of said second oscillator, the output of said second isolating impedance energizing said second input circuit of said mixer, and a high-pass filter having its input energized by the output of said mixer, the output of said filter being an amplitude modulated signal having a frequency instantaneously equal to the difference between the frequency of said first oscillator and the frequency of said second oscillator.

3. Apparatus for visually indicating the frequency response characteristics of an electrical circuit comprising, the apparatus of claim 2 in which the output of said filter is connected to the input of the circuit under test, a detector having its input energized by the output of said circuit under test, an amplifier having its input connected to the output of said detector, said amplifier being tuned to amplify substantially only a narrow band of frequencies centered about the output frequency of said amplitude modulator, a cathode ray tube having its vertical deflection plates energized by the output of said amplifier, a horizontal sweep transformer energized by said power source, the output of said transformer energizing the horizontal deflection plates of said cathode ray tube, and an intensifier gate generator energized by said power source, the output of said gate generator being impressed upon the electrodes of said cathode ray tube to increase the beam intensity, whereby the trace appearing upon said tube is a representation of the frequency response characteristics of said electrical circuit under test.

4. A system for testing the frequency response characteristics of an electronic circuit comprising, an amplitude modulated oscillator, a frequency modulated oscillator, means for mixing the outputs of said oscillators, means for deriving an amplitude modulated difference frequency signal of constant power output from said mixing means, means for applying said difference frequency component to said electronic circuit, means for abstracting said amplitude modulation component from the output of said electronic circuit, and means for comparing the output of said circuit to a reference value.

5. A system for testing the frequency response characteristics of an electronic circuit comprising, an amplitude modulated oscillator, a frequency modulated oscillator, a mixer for mixing the outputs of said oscillators, a high pass filter for attenuating all but a constant power amplitude modulated difference frequency signal of a high ratio of frequency deviation to center frequency, means for applying said amplitude modulated signal to said electronic circuit, and means for displaying the output from said electronic circuit to determine the frequency response of said circuit.

6. Apparatus as in claim 5 wherein said amplitude modulated oscillator is modulated by a square wave generator.

7. Apparatus as in claim 5 wherein said frequency modulated oscillator is modulated by a rotating element in the frequency determining circuit of said frequency modulated oscillator.

8. Apparatus as in claim 5 including a power source, a synchronous modulating motor, a sweep voltage transformer, and an intensifying circuit, said three last-mentioned elements being simultaneously energized by said power source, said synchronous motor providing mechanical rotation for modulating said frequency modulated oscillator, said sweep transformer and said intensifying circuit being operative on said display means in synchronism with said frequency modulation.

References Cited in the file of this patent

UNITED STATES PATENTS

| | | |
|---|---|---|
| 1,740,859 | Hammond | Dec. 24, 1929 |
| 2,151,313 | Bagno et al. | Mar. 21, 1939 |
| 2,189,457 | Archer | Feb. 6, 1940 |
| 2,205,190 | Farrington | June 18, 1940 |
| 2,215,197 | Sherman | Sept. 17, 1940 |
| 2,243,234 | Von Duhn | May 27, 1941 |
| 2,262,149 | Slonczewski | Nov. 11, 1941 |
| 2,380,791 | Rosencrans | July 31, 1945 |
| 2,401,411 | Carlisle | June 4, 1946 |
| 2,490,448 | Lott | Dec. 6, 1949 |
| 2,510,906 | Reid | June 6, 1950 |

FOREIGN PATENTS

| | | |
|---|---|---|
| 113,637 | Australia | Aug. 21, 1941 |